(12) United States Patent
Jackson

(10) Patent No.: US 6,703,300 B2
(45) Date of Patent: Mar. 9, 2004

(54) METHOD FOR MAKING MULTILAYER ELECTRONIC DEVICES

(75) Inventor: Thomas N. Jackson, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 10/112,088

(22) Filed: Mar. 29, 2002

(65) Prior Publication Data

US 2002/0151101 A1 Oct. 17, 2002

Related U.S. Application Data

(60) Provisional application No. 60/280,197, filed on Mar. 30, 2001.

(51) Int. Cl.⁷ .................. H01L 21/265; H01L 21/00; H01L 21/44
(52) U.S. Cl. .................. 438/618; 438/491; 438/514; 438/654; 438/685; 438/936
(58) Field of Search .................. 438/618, 659, 438/692, 283, 166, 628, 644, 654, 685, 151, 486, 907, 908, 598, 491, 514, 936

(56) References Cited

U.S. PATENT DOCUMENTS

| | | | | |
|---|---|---|---|---|
| 3,617,463 A | * | 11/1971 | Gregor et al. ......... | 204/298.31 |
| 4,138,284 A | * | 2/1979 | Postupack ............. | 156/100 |
| 4,392,451 A | * | 7/1983 | Mickelsen et al. ...... | 118/690 |
| 4,405,710 A | * | 9/1983 | Balasubramanyam et al. ............. | 430/311 |
| 5,319,279 A | * | 6/1994 | Watanabe et al. ....... | 313/309 |
| 5,883,000 A | * | 3/1999 | Pasch .................. | 438/618 |
| 5,997,958 A | | 12/1999 | Sato et al. ............ | 427/468 |
| 6,114,099 A | | 9/2000 | Liu et al. ............. | 430/324 |
| 6,117,781 A | * | 9/2000 | Lukanc et al. ......... | 438/692 |
| 6,284,317 B1 | | 9/2001 | Laibinis et al. ....... | 427/258 |
| 6,291,345 B1 | * | 9/2001 | Golecki et al. ........ | 438/659 |
| 6,344,419 B1 | * | 2/2002 | Forster et al. ........ | 438/758 |
| 6,365,466 B1 | | 4/2002 | Krivokapic ............ | 438/283 |
| 6,395,454 B1 | | 5/2002 | Piscevic .............. | 430/311 |
| 2002/0073918 A1 | * | 6/2002 | Reade et al. .......... | 117/84 |

OTHER PUBLICATIONS

International Search Report dated Jul. 11, 2002. PCT/US02/09754, filed Mar. 29, 2002.

\* cited by examiner

*Primary Examiner*—Michael S. Lebentritt
(74) *Attorney, Agent, or Firm*—Ohlandt, Greeley, Ruggiero & Perle LLP

(57) ABSTRACT

There is a method for forming a multilayer electronic device. The method has the following steps: a) depositing a thin molecular layer on an electrically conductive substrate and b) depositing metal atoms or ions on the thin molecular layer at an angle of about 60 degrees or less with respect to the plane of the exposed surface of the thin molecular layer.

17 Claims, 1 Drawing Sheet

METHOD FOR MAKING MULTILAYER ELECTRONIC DEVICES

This application claims priority from U.S. Provisional Application No. 60/280,197, filed Mar. 30, 2001.

BACKGROUND OF THE INVENTION

1. Field of the Invention

The present invention generally relates to a method for forming a multilayer electronic device. More particularly, the present invention relates to a method for forming a multilayer electronic device wherein a thin molecular layer is deposited on a substrate. Still more particularly, the invention relates to a method for forming a multilayer electronic device wherein a metal atoms or ions are deposited on the thin molecular layer to form a metallic layer thereon.

2. Description of the Prior Art

There is increasing commercial interest in electronic devices fabricated using molecular monolayers or a small number of molecular layers of materials. Examples of materials useful in thin molecular layers are alkanethiols, such as mercaptohexadecanoic acid and nitrobenzenethiol. Such thin molecular layers can be applied to or deposited upon substrates using techniques such as thiol or isonitrile attachment to metals or silane coupling to oxides, or by alternate techniques such as Langmuir-Blodgett deposition.

In electronic devices, it is frequently necessary to make electrical contact with thin molecular layers. In particular, it is also important to provide electrical contact top both sides of a thin molecular layer between opposing metal surfaces or substrates. Such devices are typically formed by applying a thin molecular layer to a metal substrate or other conducting substrate followed by application of a metallic layer to the exposed surface of the thin molecular layer. The first step seldom presents manufacturing problems since there are a number of approaches, including liquid or vapor phase self-assembly chemistry, such as using thiol, isonitriles, or Langmuir-Blodgett deposition, vapor deposition or solvent casting whereby the thin molecular layers attach securely to the metal substrate. However, the second step, application of the metallic layer to the exposed surface of the thin molecular layer, is problematic because the metal atoms applied to the surface can infiltrate it and cause the formation of electrical short circuits in the thin molecular layer. In conventional deposition processes, the incoming metal atoms or ions can have sufficient energy and mobility to pass through the molecular layer to wet the underlying metal. Infiltration is a particular problem when surface energy differences between the molecular layer and underlying metal promote migration or deposition of adatoms to the underlying conducting substrate.

One means of addressing the problem of infiltration or penetration of metal atoms or ions into the thin molecular layer has been to employ reactant groups at the surface of the layer capable of reacting with or binding to the metal atoms or ions being deposited there. Another means of addressing the problem has been to reduce the temperature of the substrate and the thin molecular layer to reduce the mobility of incoming metal atoms or clusters at the surface of the layer.

It would be highly desirable to have a method for depositing metal atoms or ions on a thin molecular layer on a substrate to form a multilayer electronic device. It would further be desirable to have a method for depositing metal atoms or ions on a substrate having a thin molecular layer wherein defects are substantially not present and/or infiltration of metal adatoms into the thin molecular layer is substantially prevented. It would still be further desirable to have a method for depositing a metallic layer on a substrate having a layer of an electroconductive electroactive, or electrooptic organic material.

SUMMARY OF THE INVENTION

According to the present invention, there is a method for forming a multilayer electronic device. The method has the following steps: a) depositing a thin molecular layer on an electrically conductive substrate and b) depositing metal atoms or ions on the thin molecular layer at an angle of about 60 degrees or less with respect to the plane of the surface of the thin molecular layer.

DETAILED DESCRIPTION OF THE INVENTION

It was found surprising that the incidence of defects and short circuits in the manufacture of multilayer microelectronic devices could be substantially reduced or eliminated by depositing metal atoms or ions on a substrate at an oblique angle rather than a normal angle. The unique oblique angle of deposition is at about 60 degrees or less with respect to the plane of the exposed surface of the thin molecular layer.

Conventionally in microelectronic applications, metal atoms have been deposited at a generally normal angle or perpendicular to the plane of the substrate. Unfortunately, deposition at such an angle has exacerbated the problem of infiltration or penetration of metal atoms or ions into thin molecular structures.

Figure 1:
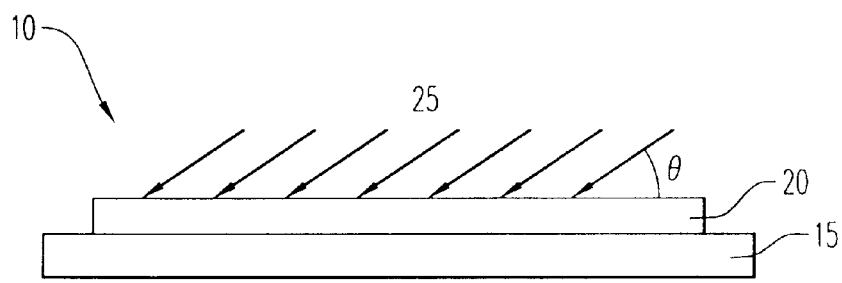
FIG. 1 is a drawing of a microelectronic device formed according to the method of the present invention.

The present invention addresses the problem of infiltration or penetration by metal atoms or ions by depositing them on the exposed surface of the thin molecular layer at an angle oblique to the plane of the thin molecular layer. An oblique angle is an angle corresponding to about 60 degrees or less and preferably about 30 degrees or less with respect to the stream or flux of incoming metal atoms or ions and the plane of the exposed surface of the thin molecular layer. In the instance of a flat, thin molecular layer, the plane will correspond the flat exposed surface of that layer. Typically, the thin molecular layer will correspond in shape and contour to the substrate to which it is attached. Most typically, both the thin molecular layer and the substrate will be flat. FIG. 1 illustrates the deposition of metal atoms on a substrate having a flat surface, and is generally represented by the numeral 10. Substrate base 15 has a thin molecular layer 20. Metal atoms 25 (or ions) are deposited on layer 20 at an oblique angle θ. In the instance of an uneven surface, e.g. an undulated, curved or rounded surface, the plane will correspond to the plane tangential to the point of deposition on the surface of the thin molecular layer.

Any technique or method of deposition of metal known in the art may be employed in the present invention. Useful methods include evaporative deposition, sputtering and ion beam deposition. Teachings to techniques and methods of deposition are disclosed in *Thin-Film Deposition: Principles and Practice*, Donald L. Smith, McCraw-Hill (1995), ISBN: 0070585024.

The thin molecular layer can be comprised of any material known to be useful in the microelectronics art. The material can be organic or inorganic. Particularly useful materials are the alkanethiols, such as mercaptohexadecanoic acid, nitrobenzenethiol, viologens, Prussian blue and so-called electrochromic and photochromic materials. The thin molecular layer may be thin, e.g. about 10 nanometers (nm) or less and down to 3 nanometers or less. The layer can be several molecules thick or even a single molecule thick. In a particular embodiment, a microelectronic device may have a thin molecular layer of an alkanethiol at a thickness of about 10 nanometers or less.

The thin molecular layer is applied to and supported by a substrate that can be any electrically conductive metal or solid inorganic material known in the art. Useful metals include gold, silver, aluminum, chromium, nickel, iron, tungsten, zinc, copper, platinum, palladium, tin and alloys of any of the foregoing. Useful electrically conductive inorganic materials include indium tin dioxide or semiconductors such as silicon, germanium, silicon germanium, gallium arsenide, aluminum arsenide, silicon carbide, gallium nitride, aluminum nitride, indium nitride, indium phosphide, indium arsenide and alloys between these and/or other materials.

The method of the present invention can be used to produce a variety of multilayer microelectronic devices. Useful devices include molecular storage or memory devices, molecular diodes, molecular transistors, molecular imaging devices, resistors, insulators, capacitors, dielectric devices, semiconductors, conductors and the like.

The method of the present invention can also be employed in combination with other methods for reducing the incidence of short circuits in thin molecular layers in microelectronic devices. Such methods include reactive chemistry and low temperature deposition.

The contents of U.S. Provisional Application No. 60/280,197, filed Mar. 30, 2001, are incorporated herein by reference.

EXAMPLES

Au/SAM/Al (gold/SAM/aluminum) devices are made in accordance with the present invention. SAM stands for self-assembled monolayer (thin molecular layer). An aluminum layer was deposited on mercaptohexadecanoic (MHA) and nitrobenzene thiol (NBT) layers on a gold substrate. The layering was effected via evaporative deposition at an oblique angle and at a reduced substrate/SAM temperature.

The devices use bottom contacts of ion-beam sputtered Cr and Au (2.5 nm and 50 nm respectively), which provided a relatively smooth gold surface (<3.5 Å RMS) for self-assembly. The bottom electrodes are designed as long fingers (4.5 mm) to allow shadow-mask definition of the top contact.

Samples of gold substrate are cleaned by exposure to oxygen plasma for 10 minutes followed by exposure to UV light/Ozone for 20 minutes. Contact angle was measured on a control specimen to monitor the condition of the gold surface. Contact angle was determined by standard technique by viewing edge angle of sessile water drop with a video microscope.

The substrates were transferred to a nitrogen-purged glovebox and immersed in a 1 mM alkanethiol/ethanol solution immediately following UV/Ozone exposure. Substrates are typically treated for 24 hours in the solution, washed with ethanol and dried in a nitrogen stream. Contact angle and ellipsometry were measured on a control sample to verify that a sufficiently dense SAM was formed.

Two treated and two untreated substrate samples were loaded in a high vacuum evaporator for top contact deposition. Shadow masks were used to define the deposition areas. Substrate samples were typically under vacuum within 5 minutes after cessation of treatment. One treated sample and one untreated sample were mounted at an angle of ~15° from the incident vapor flux (~15° from the plane of the MHA layer. The other treated and untreated samples were mounted at an angle of ~90° (perpendicular) from the incident vapor flux (normal incidence).

When the evaporator reached an interior pressure of $2 \times 10^{-7}$ torr, a tungsten filament with aluminum evaporant was activated (heated). The substrate samples were protected by a shutter until a deposition rate of 0.5 Å/second for the aluminum evaporant was attained. The evaporator pressure was then allowed to stabilize to $\sim 5 \times 10^{-7}$ torr. The substrate holder was exposed to a dry ice/acetone bath to cool it to approximately −72° C. The temperature of the substrate samples and substrate holder was allowed to equilibrate and the shutter was opened. Typically, ~50 nm was deposited on the substrate samples at normal incidence angle and about ~20 nm at oblique incidence.

The substrates were tested for short circuits by measurement of current density. Substrate areas were tested over areas ranging from 4 $\mu m^2$ to 1372 $\mu m^2$. Current densities ranging from $10^{-6}$ to $10^{-4}$ Å/cm$^2$ were measured through the SAM at 1 volt for MHA and at 2.5 V for NBT.

As expected, devices fabricated on substrate samples without SAM (untreated) exhibited only short circuits whether mounted at normal or oblique incidence. Also, treated substrate samples mounted at normal angle typically exhibited short circuits with large current density (>1 Å/cm$^2$).

Figure 2:
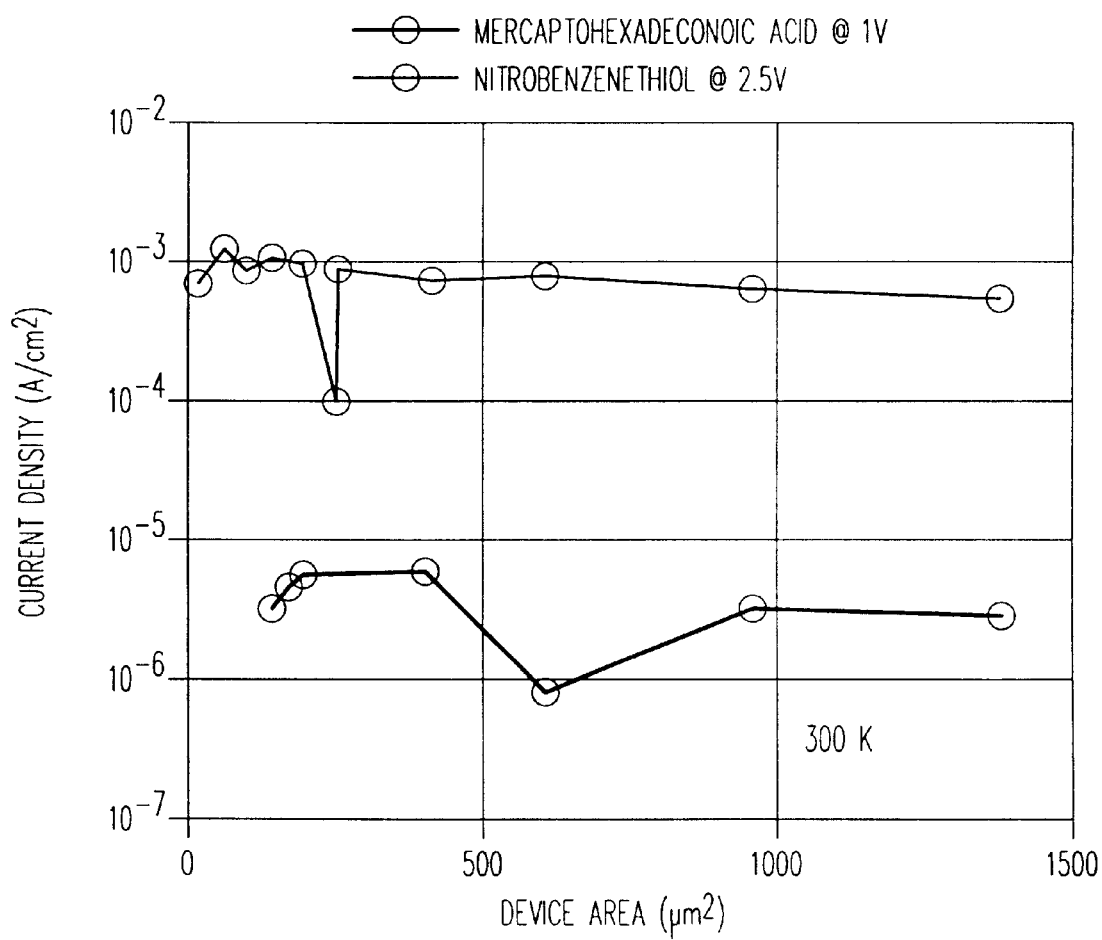
FIG. 2 is a graph showing plots of device area versus current density for embodiments of microelectronic devices formed according to the method of the present invention.

However, treated substrate samples mounted at oblique angles exhibited a high yield of non-shorted devices with low current density. FIG. 2 shows the current density characteristics of a 196 $\mu m^2$ Au/MHA/Al and AU/NBT/AL devices measured at room temperature. The higher yield of non-shorted devices indicates little or no penetration or infiltration of the alkanethiol layer by the aluminum atoms. For this measurement, the bias on the bottom gold contact was varied with respect to the top aluminum contact. Notably, current density varies by only about a factor of two for areas between 4 and 1400 $\mu m^2$.

It should be understood that the foregoing description is only illustrative of the present invention. Various alternatives and modifications can be devised by those skilled in the art without departing from the invention. Accordingly, the present invention is intended to embrace all such alternatives, modifications and variances that fall within the scope of the appended claims.

What is claimed is:

1. A method for forming a multilayer electronic device, comprising:
    a) depositing a thin molecular layer of an organic material on an electrically conductive substrate and
    b) depositing metal atoms or ions on the exposed surface of the thin molecular layer at an angle of about 60 degrees or less with respect to the plane of the exposed surface of the thin molecular layer.

2. The method of claim 1, wherein the metal atoms or ions are deposited at an angle of about 30 degrees or less with respect to the surface of the thin molecular layer.

3. The method of claim 1, wherein the organic material is an alkanethiol.

4. The method of claim 3, wherein the alkanethiol is mercaptohexadecanoic acid.

5. The method of claim 3, wherein the alkanethiol is nitrobenzenethiol.

6. The method of claim 1, wherein the organic material has moieties selected from the group consisting of phenyl, nitro, sulfur, nitrile, and viologen groups.

7. The method of claim 2, wherein the thin molecular layer is about 10 nanometers or less in thickness.

8. The method of claim 2, wherein the thin molecular layer is about 3 nanometers or less in thickness.

9. The method of claim 2, wherein the thin molecular layer is one molecule thick.

10. The method of claim 1, wherein the metal atoms are deposited on the substrate at an angle of about 30 degrees or less with respect to the plane of the substrate.

11. The method of claim 1, wherein the metal atoms are selected from the group consisting of aluminum, silver, gold, copper, platinum, palladium, nickel, titanium and chromium.

12. The method of claim 1, wherein the metal atoms are deposited via evaporative deposition.

13. The method of claim 1, wherein the metal atoms are deposited via sputtering.

14. The method of claim 1, wherein the metal atoms are deposited via ion beam deposition.

15. The method of claim 1, wherein the substrate is a metal.

16. The method of claim 15, wherein the metal is selected from the group consisting of aluminum, silver, gold, copper, platinum, palladium, nickel, titanium and chromium.

17. The method of claim 1, wherein the substrate and the thin molecular layer are flat.

* * * * *

UNITED STATES PATENT AND TRADEMARK OFFICE
CERTIFICATE OF CORRECTION

PATENT NO. : 6,703,300 B2
DATED : March 9, 2004
INVENTOR(S) : Thomas N. Jackson

It is certified that error appears in the above-identified patent and that said Letters Patent is hereby corrected as shown below:

Column 1,
Line 5, after "March 30, 2001" please insert the following:
-- This invention was made with support from the Government under DARPA/Air Force Contract No.: F33615-98-5164. The Government has certain rights in the invention --.

Signed and Sealed this

Twenty-seventh Day of September, 2005

JON W. DUDAS
*Director of the United States Patent and Trademark Office*